United States Patent
Lee et al.

(10) Patent No.: US 7,245,027 B2
(45) Date of Patent: Jul. 17, 2007

(54) APPARATUS AND METHOD FOR SIGNAL BUS LINE LAYOUT IN SEMICONDUCTOR DEVICE

(75) Inventors: Chang-Ho Lee, Suwon-si (KR); Jong-Hyun Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 216 days.

(21) Appl. No.: 10/823,858

(22) Filed: Apr. 14, 2004

(65) Prior Publication Data
US 2004/0256741 A1    Dec. 23, 2004

(30) Foreign Application Priority Data
Jun. 17, 2003   (KR) .................. 10-2003-0039163

(51) Int. Cl.
*H01L 23/48* (2006.01)
(52) U.S. Cl. .................................... 257/782
(58) Field of Classification Search ........ 257/724–728, 257/734, 691, 296, 682, E23.07
See application file for complete search history.

(56) References Cited

U.S. PATENT DOCUMENTS

| | | | | |
|---|---|---|---|---|
| 5,128,737 A | * | 7/1992 | van der Have | 257/503 |
| 5,365,103 A | * | 11/1994 | Brown et al. | 257/497 |
| 6,246,118 B1 | * | 6/2001 | Buynoski | 257/758 |
| 2002/0084536 A1 | * | 7/2002 | Sundahl et al. | 257/784 |
| 2005/0110136 A1 | * | 5/2005 | Rakshani | 257/724 |
| 2006/0131748 A1 | * | 6/2006 | Seshan | 257/737 |

* cited by examiner

*Primary Examiner*—Nathan W. Ha
(74) *Attorney, Agent, or Firm*—Mills & Onello, LLP (57) ABSTRACT

A device and method for layout and fabrication of power supply bus lines in an integrated circuit such as a memory circuit are described. In accordance with the present invention, power bus lines and bonding pads of the circuit are not necessarily formed in both edge regions and center regions of the device. The bonding pads are formed in the region according to the package being used, and the power bus lines are formed in the other region. This is accomplished by forming the bonding pads over landing pads. Landing pads are formed in both the center region and the edge region under the top surface of the device. If the device is to be packaged in an edge pad configuration, the bonding pads are formed over the landing pads in the edge region, and power supply bus lines can be formed over the landing pads in the center region. Similarly, if the device is to be packaged in a center pad configuration, the bonding pads are formed over the landing pads in the center region, and the power supply bus lines can be formed over the landing pads in the edge region. The bonding pads are connected to the landing pads by conductive vias. Because the power bus lines are not formed in the same region as bonding pads, they can occupy a relatively large portion of the region in which they are formed. That is, they can be made much larger than they would be using the conventional approach in which both bonding pads and power bus lines are formed in the same region. As a result, the power noise drawbacks of the conventional approach are eliminated.

35 Claims, 7 Drawing Sheets

APPARATUS AND METHOD FOR SIGNAL BUS LINE LAYOUT IN SEMICONDUCTOR DEVICE

RELATED APPLICATION

This application relies for priority on Korean Patent Application number 2003-39163, filed on Jun. 17, 2003, the contents of which are incorporated herein in their entirety by reference.

FIELD OF THE INVENTION

The invention relates to a signal bus line layout approach in a semiconductor device, and, more particularly, to an approach for efficiently laying out a power bus line in a semiconductor device such as a memory device to reduce power noise while not increasing chip size.

BACKGROUND OF THE INVENTION

Many semiconductor devices include multiple circuits such as memory blocks disposed in a two-dimensional array. The array of circuits defines an edge region at the edges of the array of circuits and a center region between the circuits. Typically, connections are made in either or both of the edge region and the center region. To that end, bonding pads are typically formed in both regions. Also, power bus lines must be routed throughout the device, and, typically, the power bus lines are also formed in both the edge region and the center region of the device.

It is common to fabricate semiconductor integrated circuits to accommodate more than one kind of device package. For example, certain integrated circuits, such as memory circuits, are packaged in a board on chip (BOC) package or a multi-chip package (MCP). Typically, the BOC uses connections to the bonding pads in the center region of the circuit and is therefore commonly referred to as having a center pad configuration. On the other hand, the MCP typically uses the pads in the edge region and is therefore commonly referred to as having an edge pad configuration.

The circuits are manufactured to accommodate both types of packages. That is, the circuits are typically fabricated such that they can be packaged in either type of package. To that end, both bonding pads and power bus lines are formed in both the edge region and the center region of the devices. Subsequently, when the chip is packaged, connections are made to the appropriate bonding pads, i.e., edge region or center region, based on the package. Because both power lines and bus lines are formed in both regions, the bus lines must be made small to allow them to fit in the space between the individual circuits in the center region and between the circuits and the edge of the device in the edge region.

The small power lines have certain drawbacks. For example, because of the relatively low conductivity of the small power bus lines, the circuit can experience power noise problems. The power noise can be particularly high in certain particular regions of the device, depending on whether the device is connected in an edge pad configuration or a center pad configuration.

SUMMARY OF THE INVENTION

The present invention is directed to an approach to laying out and fabricating power bus lines in an integrated circuit device that alleviates the drawbacks of the prior approaches. In accordance with the present invention, the power bus lines and bonding pads are not necessarily formed in both the edge regions and the center regions of the device. The bonding pads are formed in the region according to the package being used, and the power bus lines are formed in the other region. This is accomplished by forming the bonding pads over landing pads. Landing pads are formed in both the center region and the edge region under the top surface of the device. If the device is to be packaged in an edge pad configuration, the bonding pads are formed over the landing pads in the edge region, and power supply bus lines can be formed over the landing pads in the center region. Similarly, if the device is to be packaged in a center pad configuration, the bonding pads are formed over the landing pads in the center region, and the power supply bus lines can be formed over the landing pads in the edge region. The bonding pads are connected to the landing pads by conductive vias. Because the power bus lines are not formed in the same region as bonding pads, they can occupy a relatively large portion of the region in which they are formed. That is, they can be made much larger than they would be using the conventional approach. As a result, the power noise drawbacks of the prior approach are eliminated.

In accordance with a first aspect, the present invention is directed to a semiconductor device. The device of the invention includes a plurality of landing pads formed in the semiconductor device, the landing pads being sized and shaped to be used with bonding pads. A plurality of bonding pads are formed over a first portion of the landing pads. A power supply line is formed over a second portion of the landing pads.

In one embodiment, the bonding pads are formed in a first direction on the semiconductor device and the power supply line is formed in a second direction. The two directions can be perpendicular.

In one embodiment, the power supply line is a power voltage supply line. The power supply line can be a ground line.

In one embodiment, the device also includes a second power supply line formed over the second portion of the landing pads. One of the power supply lines is either a power voltage line and a ground line. The other of the power supply lines is the other of the power voltage line and the ground line.

Each of the landing pads can include a conductive layer. The conductive layer can be a metal layer or a polysilicon layer.

In one embodiment, each of the landing pads comprises a gate polysilicon layer, a plate polysilicon layer and a metal layer.

In one embodiment, the semiconductor device is a memory circuit. The memory circuit can include a plurality of memory blocks defining a center region of the semiconductor device between memory blocks and an edge region at an edge of the memory blocks. The landing pads can be formed in both the center region and the edge region.

In one embodiment, one of the bonding pads and the power line is formed in one of the center region and the edge region, and the other of the bonding pads and the power line is formed in the other of the center region and the edge region.

The device of the invention can be used in a board on chip (BOC) configuration or a multichip package (MCP) configuration.

In accordance with another aspect, the invention is directed to a semiconductor device comprising a plurality of circuit blocks defining a center region between circuit blocks and an edge region at an edge of the circuit blocks. A first plurality of landing pads are formed in the center region and a second plurality of landing pads are formed in the edge region, the landing pads being sized and shaped to be used with bonding pads. A plurality of bonding pads are formed over one of the first plurality of landing pads and the second plurality of landing pads. A power supply line is formed over the other of the first plurality of landing pads and the second plurality of landing pads.

The circuit blocks can be memory blocks.

In one embodiment, the bonding pads are formed in the center region, and the power supply line is formed in the edge region. Alternatively, the power supply line is formed in the center region, and the bonding pads are formed in the edge region.

In one embodiment, the bonding pads are formed in a first direction on the semiconductor device and the power supply line is formed in a second direction.

In one embodiment, the power supply line is a power voltage supply line. The power supply line can be a ground line.

A second power supply line can be formed over the other of the first plurality of landing pads and the second plurality of landing pads.

In one embodiment, one of the first and second power supply lines is one of a power voltage line and a ground line. The other of the first and second power supply lines in the other of the power voltage line and the ground line.

In one embodiment, each of the landing pads comprises a conductive layer. Each of the landing pads can include a metal layer. Each of the landing pads can include a polysilicon layer. Each of the landing pads can include a gate polysilicon layer, a plate polysilicon layer and a metal layer.

The device of the invention can be used in a board on chip (BOC) configuration or a multichip package (MCP) configuration.

In another aspect, the invention is directed to a method of manufacturing a semiconductor device. According to the method, a plurality of landing pads are formed in the semiconductor device, the landing pads being sized and shaped to be used with bonding pads. A plurality of bonding pads are formed over a first portion of the landing pads. A power supply line is formed over a second portion of the landing pads.

In one embodiment, the bonding pads are formed in a first direction on the semiconductor device and the power supply line is formed in a second direction.

In one embodiment, a second power supply line is formed over the second portion of the landing pads.

In one embodiment, the semiconductor device is a memory circuit.

In one embodiment, a plurality of memory blocks are formed defining a center region of the semiconductor device between memory blocks and an edge region at an edge of the memory blocks. The landing pads are formed in both the center region and the edge region. In one embodiment, one of the bonding pads and the power line is formed in one of the center region and the edge region, and the other of the bonding pads and the power line is formed in the other of the center region and the edge region.

The method can be used in forming the device in a board on chip (BOC) configuration or a multichip package (MCP) configuration.

In another aspect, the invention is directed to a method of manufacturing a semiconductor device. In accordance with the method, a plurality of circuit blocks are formed defining a center region between circuit blocks and an edge region at an edge of the circuit blocks. A first plurality of landing pads are formed in the center region and a second plurality of landing pads are formed in the edge region, the landing pads being sized and shaped to be used with bonding pads. A plurality of bonding pads are formed over one of the first plurality of landing pads and the second plurality of landing pads. A power supply line is formed over the other of the first plurality of landing pads and the second plurality of landing pads.

In one embodiment, the circuit blocks are memory blocks.

The bonding pads can be formed in the center region, and the power supply line can be formed in the edge region. The power supply line can be formed in the center region, and the bonding pads can be formed in the edge region.

The bonding pads can be formed in a first direction on the semiconductor memory device and the power supply line can be formed in a second direction. A second power supply line can be formed over the other of the first plurality of landing pads and the second plurality of landing pads.

In one embodiment, one of the first and second power supply lines is one of a power voltage line and a ground line.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
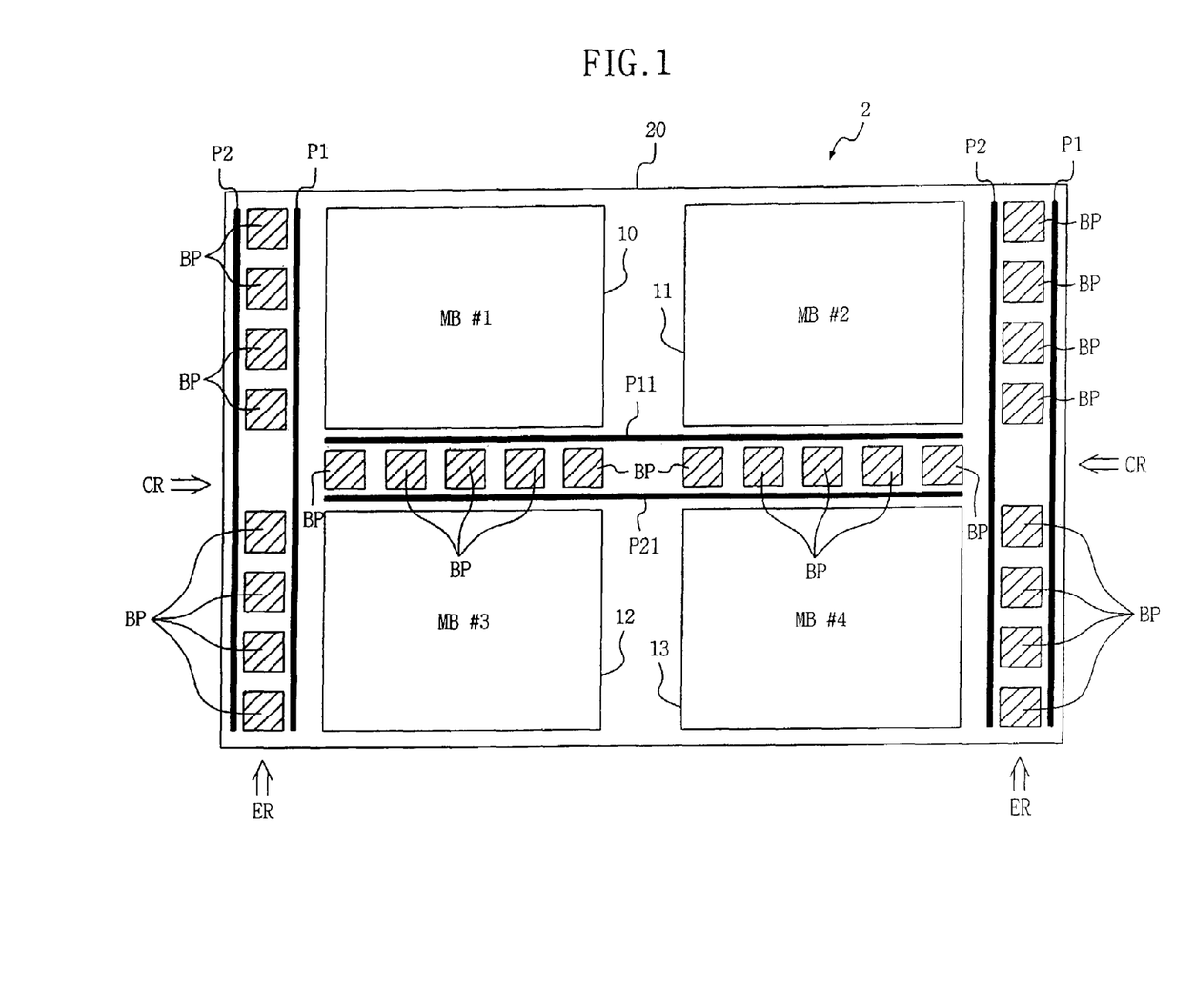
FIG. 1 is a schematic diagram illustrating a layout of bonding pads and power supply bus lines in a conventional semiconductor memory device.

FIG. 1 is a schematic diagram illustrating a layout of bonding pads and power supply bus lines in a conventional semiconductor memory device. The device 2 includes a plurality of memory blocks 10, 11, 12 and 13 on a substrate 20. A center region CR is defined between the memory blocks as shown, and edge regions ER are defined between the memory blocks and the edges of the substrate 20. A plurality of bonding pads BP are formed in both the edge regions ER and the center region CR as shown. In each of the regions, a pair of power supply bus lines is also formed. Specifically, in the edge regions ER, power supply bus lines P1 and P2 are formed on opposite sides of the bonding pads BP, and power supply bus lines P11 and P21 are formed in the center region on opposite sides of the bonding pads BP.

The device in FIG. 1 is fabricated to accommodate both a center pad configuration and an edge pad configuration. Accordingly, bonding pads BP as well as power supply lines P1, P2, P11 and P21 are formed in both the center region CR and the edge regions ER. Because both regions are made to accommodate both bonding pads and power supply lines, the power supply lines must be formed to the sides of the bonding pads. Given the limited amount of space in the edge regions ER and center region CR, the power supply lines must be made thin, resulting in decreased conductivity and power supply signal noise effects.

Figure 2:
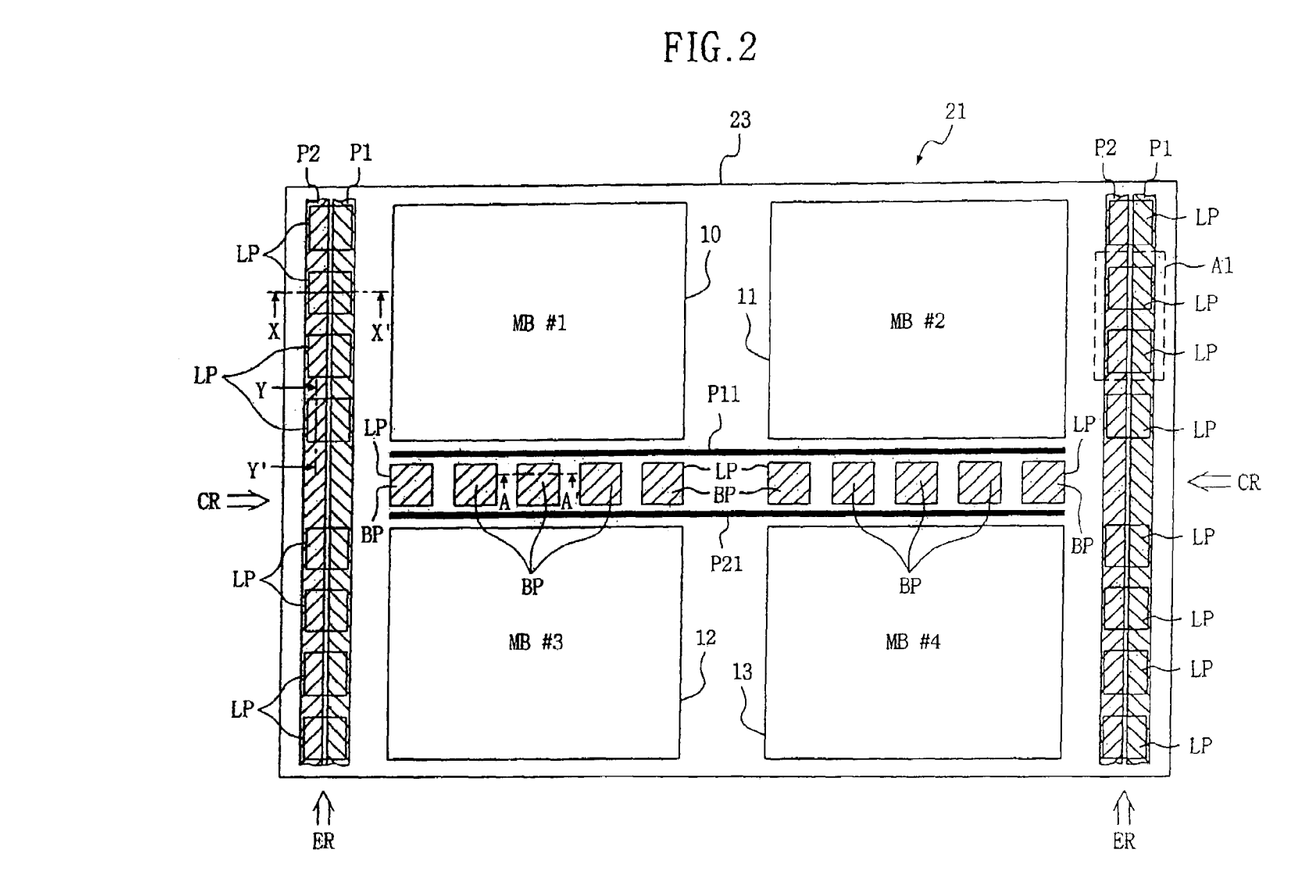
FIG. 2 is a schematic diagram illustrating a layout of bonding pads and power supply bus lines in a semiconductor memory device applied to a center pad system according to an embodiment of the present invention.

FIG. 2 is a schematic diagram illustrating a layout of bonding pads and power supply bus lines in a semiconductor memory device applied to a center pad system according to an embodiment of the present invention. The device 21 of FIG. 2 includes a plurality of memory blocks 10, 11, 12, 13 formed on a substrate 23. The memory blocks 10, 11, 12, 13 define a center region CR and edge regions ER. In accordance with the invention, landing pads LP are formed in both the center region CR and the edge regions ER under the surface of the device. Since the device 21 has an edge pad configuration, bonding pads BP are formed over the landing pads LP in the center region. Also, because of the center pad configuration, bonding pads are not needed in the edge region, and, therefore, they are not formed in the edge regions ER. Instead, power supply lines P1, P2 are formed in the edge regions over the landing pads LP.

Because bonding pads do not need to be accommodated in the edge regions, the power supply lines P1, P2 can be made relatively wide. This results in increased conductivity of the power supply bus lines P1, P2 and reduced power supply signal noise. It is noted that in the center region CR, conventional size power supply lines P11 and P21 can also be formed spaced apart from the landing pads LP and bonding pads BP in the center region CR.

Figure 3A:
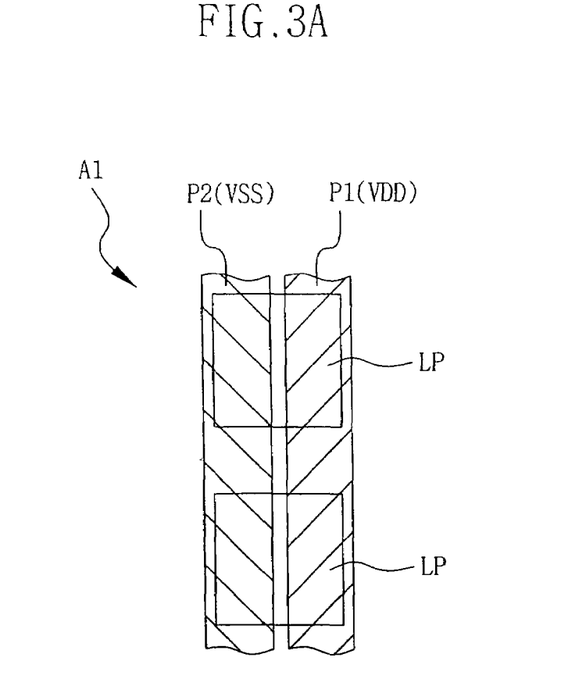
FIG. 3A is a partial expanded view of a portion of the device of FIG. 2 illustrating a pair of power supply bus lines over landing pads, in accordance with the invention.

FIG. 3A is a partial expanded view of a portion A1 of the device 21 of FIG. 2. As shown in FIG. 3A, a pair of power supply bus lines P1, P2 are formed over landing pads LP. The bus line P1 can be applied to the power supply voltage VDD, and the power supply bus line P2 can be applied to the ground voltage VSS. The application of the bus lines P1, P2 to the power supply voltages can be reversed. That is, bus line P1 can be applied to VSS, and bus line P2 can be applied to VDD.

Figure 3B:
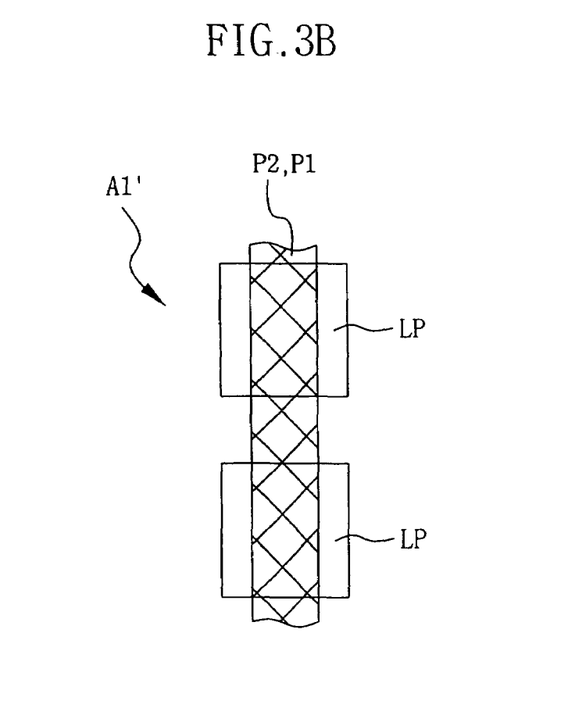
FIG. 3B is a partial expanded view of a portion of the device of FIG. 2 showing a single power bus line over landing pads, in accordance with the invention.

FIG. 2 illustrates the embodiment in which a pair of power supply bus lines P1, P2 is formed in both of the edge regions ER. In accordance with the invention, a single power supply bus line can be formed in either or both of the edge regions ER. FIG. 3B is a partial expanded view of the portion A1 of FIG. 2 of the device 23 showing a single power supply bus line over the landing pads. The single bus line is labeled P2, P1, and it may be applied to either power supply voltage VDD or ground VSS. The partial view of FIG. 3 is labeled A1' to illustrate that it is an alternative configuration in accordance with the invention. In the configuration of FIG. 3B, the single power supply bus line can be applied to either VDD or VSS. In one embodiment, the other edge region ER can be formed with another single power supply bus line which can also be applied to either VDD or VSS.

It should also be noted that in this description, power supply voltages are referred to as VDD and VSS as examples only. It will be understood that the power supply lines described herein can be applied to any power supply voltage signals.

Figure 4:
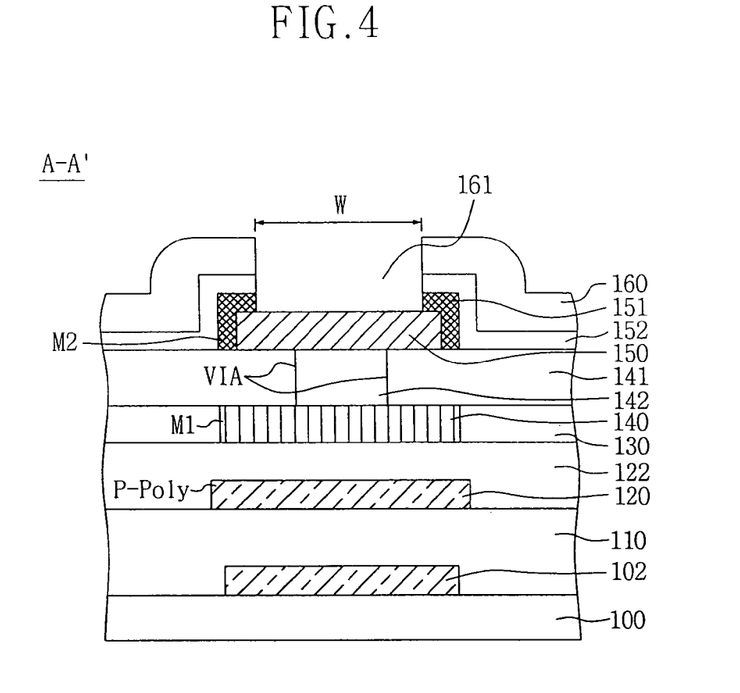
FIG. 4 is a schematic cross-sectional view of the device of FIG. 2, taken along line A–A'.

FIG. 4 is a schematic cross-sectional view of the device 23 of FIG. 2, taken along line A–A'. As shown in FIG. 4, a gate polysilicon layer 102 is formed on a substrate 100, and a dielectric film 110 is formed over the substrate 100 and the gate polysilicon 102. A first landing pad layer 120, formed of a polysilicon film, is formed on the dielectric film 110, and a second dielectric film 122 is formed over the polysilicon film 120 and dielectric film 110. A second landing pad layer 140, made of a metal M1, is formed on the dielectric film 122 in a third dielectric film 130. A conductor such as a metal 142 is formed in a via hole (VIA) formed through a fourth dielectric film 141. The bonding pad 150, which can be formed of a metal M2, is formed on the dielectric film 141 and the conductive via, such that the bonding pad 150 is connected to the landing pad 140 to provide connections to circuits in the device. A high density plasma (HDP) film 151 is formed over the bonding pad 150, and a nitride film 152 is formed over the dielectric film 141 and the HDP film 151. A protective film 160 is formed over the nitride film 152. An opening 161, having a width W, is formed through the protective film 160, the nitride film 152 and the HDP film 151 to expose the top surface of the bonding pad 150. The opening 161 provides access for bonding conductors to the bonding pad 150.

Figure 5:
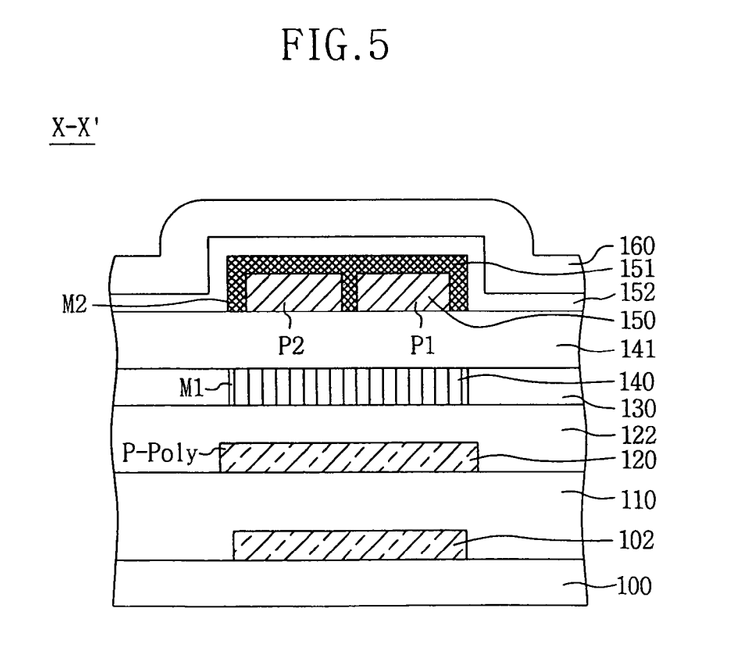
FIG. 5 is a schematic cross-sectional view of the device of FIG. 2, taken along line X–X'.
Figure 6:
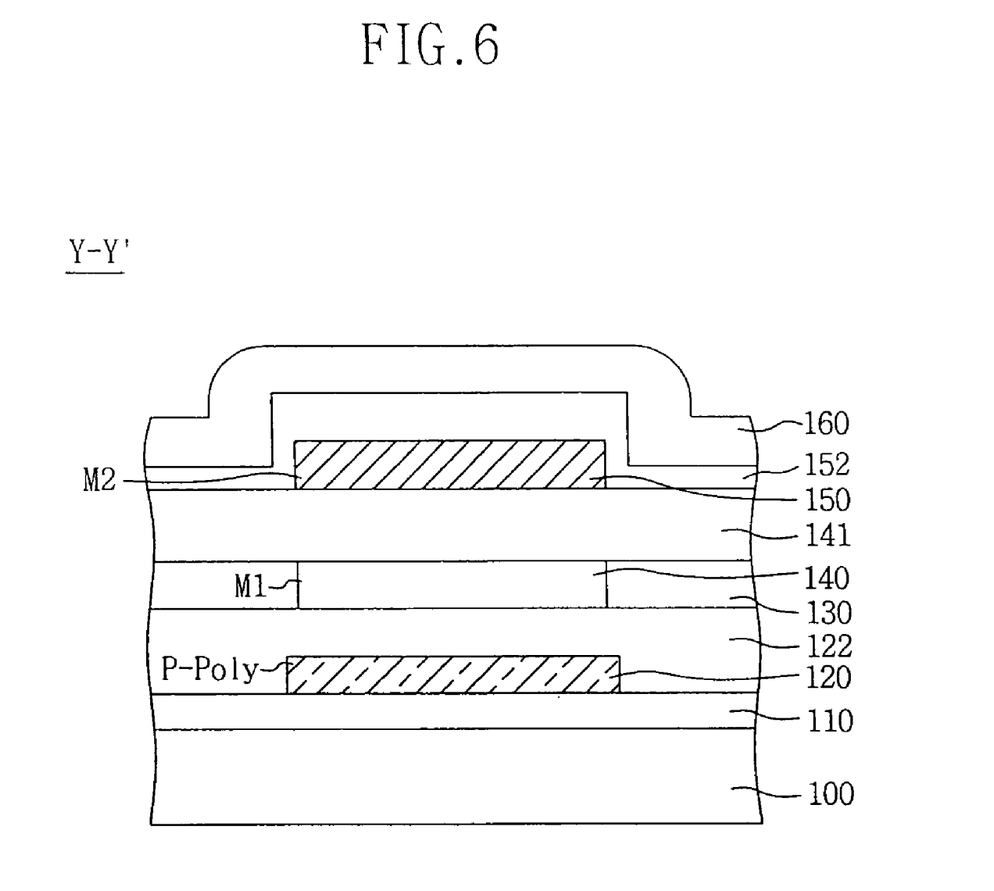
FIG. 6 is a schematic cross-sectional view of the device of FIG. 2, taken along line Y–Y'.

FIG. 5 is a schematic cross-sectional view of the device 23 of FIG. 2 taken along line X–X', and FIG. 6 is a schematic cross-sectional view of the device 23 of FIG. 2 taken along line Y–Y'. FIGS. 5 and 6 illustrate cross-sectional views of the edge region ER in which the pair of power supply bus lines P1 and P2 are formed over landing pads LP. It will be understood that, in the case of forming only a single power supply bus line, the two bus lines P1, P2 are replaced with a single bus line P1.

Referring to FIGS. 5 and 6, a gate polysilicon layer 102 is formed on a substrate 100, and a dielectric film 110 is formed over the substrate 100 in the gate polysilicon 102. A first landing pad layer 120, formed of a polysilicon film, is formed on the dielectric film 110, and a second dielectric film 122 is formed over the polysilicon film 120 and dielectric film 110. A second landing pad layer 140, made of a metal M1 is formed on the dielectric film 122 in a third dielectric film 130. A fourth dielectric film 141 is formed over the landing pad 140 and the dielectric film 130. No conductive via is found in the film 141. The conductive power supply bus lines P1 and P2, which can be formed of a metal M2, is formed on the dielectric film 141. A high density plasma (HDP) film 151 is formed over and surrounding the bus lines P1, P2, and a nitride film 152 is formed over the dielectric film 141 and the HDP film 151. A protective film 160 is formed over the nitride film 152.

Figure 7:
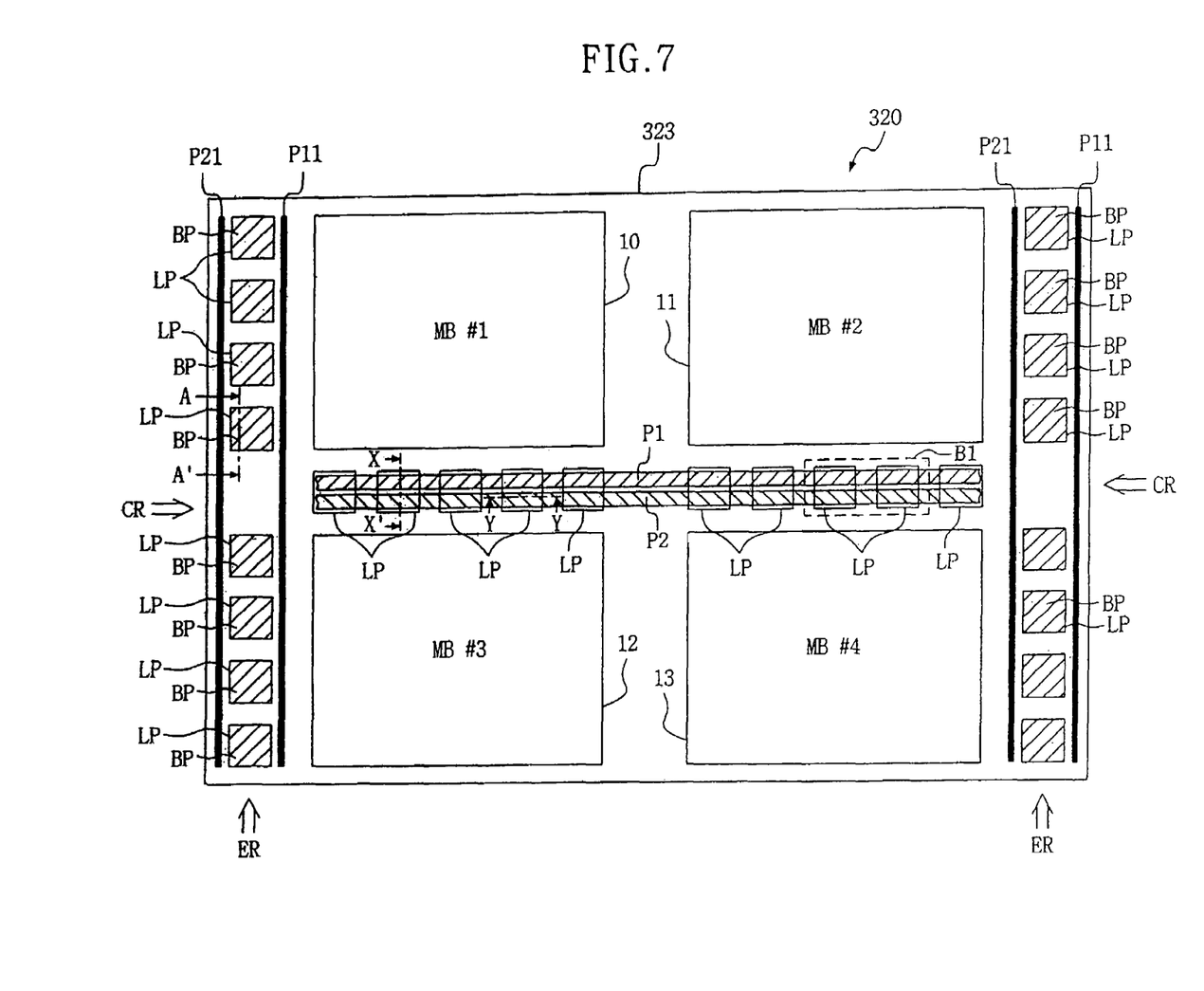
FIG. 7 is a schematic diagram illustrating a layout of bonding pads and power supply bus lines in a semiconductor memory device applied to an edge pad system according to an embodiment of the invention.

FIG. 7 is a schematic diagram illustrating a layout of bonding pads and power supply bus lines in a semiconductor memory device 320, 323 applied to an edge pad system according to an embodiment of the invention. As described above, landing pads LP are formed in both the edge regions ER and the center region CR. In FIG. 7, the edge regions ER are used for bonding connections, and, therefore, bonding pads BP are formed over the landing pads LP in the edge regions ER. The center region is used for formation of the power supply bus lines P1 and P2. It will be understood that a single power supply bus line P1 can be formed in the center region CR over the landing pads LP. Also, thinner power supply bus lines P11 and P12 can be formed in the edge regions alongside the bonding pads and landing pads. The cross-sectional view of FIG. 4 illustrates a cross-section of the device 320 of FIG. 7 taken along line A–A'. The cross-sectional view of FIG. 5 illustrates a cross-sectional view of the device 320 of FIG. 7 taken along line X–X' of FIG. 7. The cross-sectional view of FIG. 6 illustrates a cross-section of the device 320 of FIG. 7 taken along line Y–Y'.

Figure 8A:
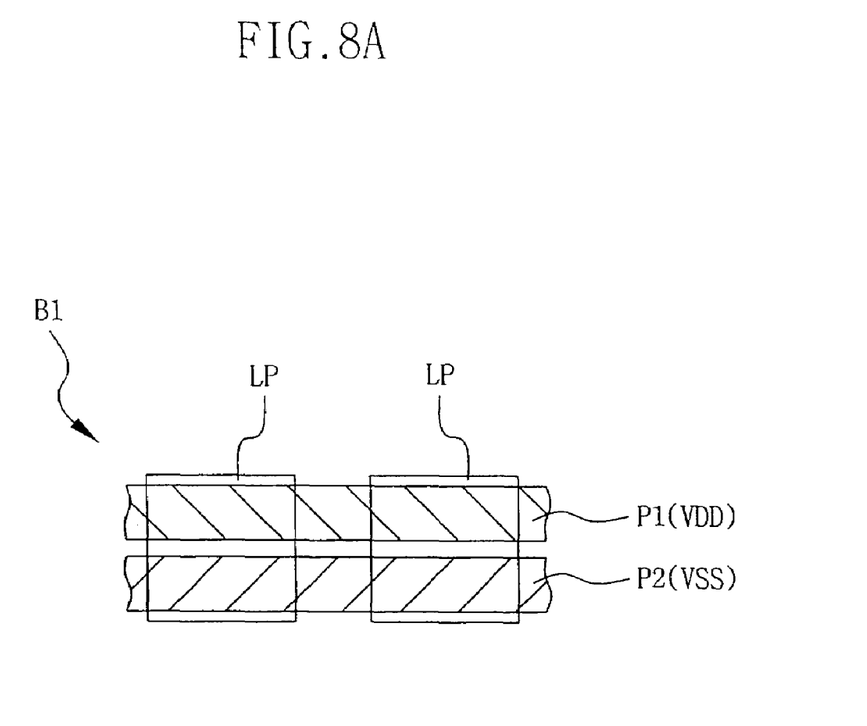
FIG. 8A is a partial expanded view of a portion of the device of FIG. 7 illustrating a pair of power supply bus lines over landing pads, in accordance with the invention.

FIG. 8A is a partial expanded view of a portion B1 of the device 320 of FIG. 7. FIG. 8A illustrates the case in which a pair of power supply bus lines P1 and P2 are formed over landing pads LP. As in the previously described embodiment, P1 and P2 may be connected to power supply voltage VDD and ground voltage VSS, respectively. Alternatively, P2 can be connected to VDD and P1 can be connected to VSS. Also, either of the bus lines P1 and P2 can be connected to any power supply voltages or ground voltage in the device.

Figure 8B:
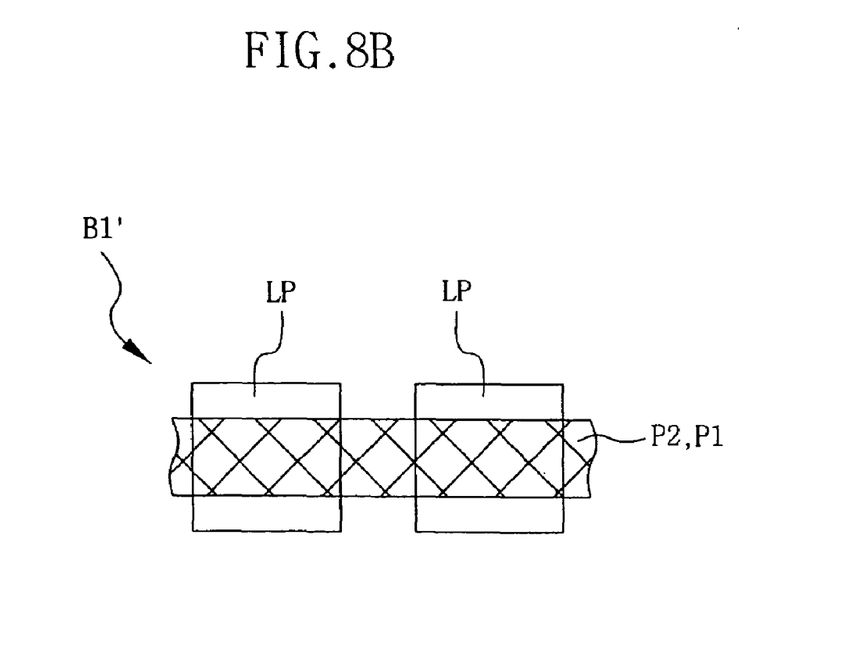
FIG. 8B is a partial expanded view of a portion of the device of FIG. 7 illustrating a single power supply bus line over landing pads, in accordance with an embodiment of the invention.

FIG. 8B is a partially expanded view of the portion B1 of the device 320 of FIG. 7 in which a single power supply bus line is formed over the landing pads LP. In FIG. 8B, the single power supply bus line is labeled P2, P1. The bus line can be connected to any power supply voltage, such as VDD, or the ground voltage VSS.

While this invention has been particularly shown and described with reference to preferred embodiments thereof, it will be understood by those skilled in the art that various changes in form and details may be made therein without departing from the spirit and scope of the invention as defined by the appended claims.

The invention claimed is:

1. A semiconductor device, comprising:
a first portion and a second portion;
first and second groups of landing pads formed in the first and second portions, respectively, of the semiconductor device, the landing pads being sized and shaped to be used with bonding pads, the first group of the landing pads being different than the second group of the landing pads;
a plurality of the bonding pads formed over the first group of the landing pads and not formed over the second group of the landing pads; and
a power supply line formed over the second group of the landing pads and not formed over the first group of the landing pads.

2. The semiconductor device of claim 1, wherein the bonding pads are formed in a first direction on the semiconductor device and the power supply line is formed in a second direction.

3. The semiconductor device of claim 2, wherein the first and second directions are perpendicular.

4. The semiconductor device of claim 2, wherein the first and second directions are different.

5. The semiconductor device of claim 1, wherein the power supply line is a power voltage supply line.

6. The semiconductor device of claim 1, wherein the power supply line is a ground line.

7. The semiconductor device of claim 1, further comprising a second power supply line formed over the second group of the landing pads.

8. The semiconductor device of claim 7, wherein one of the first and second power supply lines is one of a power voltage line and a ground line.

9. The semiconductor device of claim 8, wherein the other of the first and second power supply lines is the other of the power voltage line and the ground line.

10. The semiconductor device of claim 1, wherein each of the landing pads comprises a conductive layer.

11. The semiconductor device of claim 1, wherein each of the landing pads comprises a metal layer.

12. The semiconductor device of claim 1, wherein each of the landing pads comprises a polysilicon layer.

13. The semiconductor device of claim 1, wherein each of the landing pads comprises a gate polysilicon layer, a plate polysilicon layer and a metal layer.

14. The semiconductor device of claim 1, wherein the semiconductor device is a memory circuit.

15. The semiconductor device of claim 1, wherein the semiconductor device comprises a plurality of memory blocks defining a center region of the semiconductor device between memory blocks and an edge region at an edge of the memory blocks.

16. The semiconductor device of claim 15, wherein the first portion of the semiconductor device comprises the center region, and the second portion of the semiconductor device comprises the edge region.

17. The semiconductor device of claim 15, wherein the first portion of the semiconductor device comprises the edge region, and the second portion of the semiconductor device comprises the center region.

18. The semiconductor device of claim 15, wherein the landing pads are formed in both the center region and the edge region.

19. The semiconductor device of claim 15, wherein one of the bonding pads and the power line is formed in one of the center region and the edge region, and the other of the bonding pads and the power line is formed in the other of the center region and the edge region.

20. The semiconductor device of claim 1, wherein the device can be used in one of a board on chip (BOC) configuration and a multichip package (MCP) configuration.

21. A semiconductor device, comprising:
a plurality of circuit blocks defining a center region between circuit blocks and an edge region at an edge of the circuit blocks;
a first plurality of landing pads formed in the center region and a second plurality of landing pads formed in the edge region, the landing pads being sized and shaped to be used with bonding pads;
a plurality of bonding pads formed over one of the first plurality of landing pads and the second plurality of landing pads and not formed over the other of the first plurality of landing pads and the second plurality of landing pads; and
a power supply line formed over the other of the first plurality of landing pads and the second plurality of landing pads and not formed over the one of the first plurality of landing pads and the second plurality of landing pads.

22. The semiconductor device of claim 21, wherein the circuit blocks are memory blocks.

23. The semiconductor device of claim 21, wherein the bonding pads are formed in the center region, and the power supply line is formed in the edge region.

24. The semiconductor device of claim 21, wherein the power supply line is formed in the center region, and the bonding pads are formed in the edge region.

25. The semiconductor device of claim 21, wherein the bonding pads are formed in a first direction on the semiconductor device and the power supply line is formed in a second direction.

26. The semiconductor device of claim 21, wherein the power supply line is a power voltage supply line.

27. The semiconductor device of claim 21, wherein the power supply line is a ground line.

28. The semiconductor device of claim 21, further comprising a second power supply line formed over the other of the first plurality of landing pads and the second plurality of landing pads.

29. The semiconductor device of claim 28, wherein one of the first and second power supply lines is one of a power voltage line and a ground line.

30. The semiconductor device of claim 29, wherein the other of the first and second power supply lines in the other of the power voltage line and the ground line.

31. The semiconductor device of claim 21, wherein each of the landing pads comprises a conductive layer.

32. The semiconductor device of claim 21, wherein each of the landing pads comprises a metal layer.

33. The semiconductor device of claim 21, wherein each of the landing pads comprises a polysilicon layer.

34. The semiconductor device of claim 21, wherein each of the landing pads comprises a gate polysilicon layer, a plate polysilicon layer and a metal layer.

35. The semiconductor device of claim 21, wherein the device can be used in one of a board on chip (BOC) configuration and a multichip package (MCP) configuration.

* * * * *